(12) United States Patent
Kanagawa

(10) Patent No.: US 9,676,349 B2
(45) Date of Patent: Jun. 13, 2017

(54) SHIELD CONDUCTIVE PATH

(71) Applicant: SUMITOMO WIRING SYSTEMS, LTD., Yokkaichi, Mie (JP)

(72) Inventor: Shuichi Kanagawa, Yokkaichi (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 0 days.

(21) Appl. No.: 14/821,198

(22) Filed: Aug. 7, 2015

(65) Prior Publication Data
US 2016/0052468 A1 Feb. 25, 2016

(30) Foreign Application Priority Data
Aug. 22, 2014 (JP) ................. 2014-169011

(51) Int. Cl.
| | | |
|---|---|---|
| *H01B 7/00* | (2006.01) | |
| *H02G 15/18* | (2006.01) | |
| *H02G 3/04* | (2006.01) | |
| *B60R 16/02* | (2006.01) | |
| *H01R 4/72* | (2006.01) | |
| *H05K 9/00* | (2006.01) | |

(52) U.S. Cl.
CPC ....... *B60R 16/0215* (2013.01); *H01B 7/0045* (2013.01); *H01R 4/72* (2013.01); *H02G 3/0462* (2013.01); *H02G 15/1806* (2013.01); *H05K 9/0098* (2013.01)

(58) Field of Classification Search
CPC ... B60R 16/0215; H05K 9/007; H05K 9/0098
USPC .............................................. 174/72 A, 68.1
See application file for complete search history.

(56) References Cited

U.S. PATENT DOCUMENTS

| | | | | |
|---|---|---|---|---|
| 4,590,329 | A * | 5/1986 | Potochnik | H01R 13/59 174/76 |
| 8,146,248 | B2 * | 4/2012 | Nishimura | H01B 3/28 174/28 |
| 2002/0062975 | A1 * | 5/2002 | Matsunaga | B60R 16/0207 174/72 A |
| 2004/0099427 | A1 | 5/2004 | Kihira | |
| 2014/0110459 | A1 * | 4/2014 | Kataoka | H01R 4/021 228/111 |

FOREIGN PATENT DOCUMENTS

JP 2004-171952 A 6/2004

* cited by examiner

*Primary Examiner* — Dimary Lopez Cruz
(74) *Attorney, Agent, or Firm* — Oliff PLC

(57) ABSTRACT

A shield conductive path with which the number of manufacturing processes can be reduced is provided. The shield conductive path includes: a single-core conductor made up of a single conductor inserted into a pipe with a shield function, a stranded line conductor made up of a plurality of twisted individual wires connected to an end portion of the single core conductor, a sheathing that envelops the stranded line conductor in a state in which a junction portion of the stranded line conductor that is joined to the single-core conductor is exposed, and a shrink tube that envelops, protects and insulates the entirety of the single-core conductor and a portion of the stranded line conductor that is exposed from the sheathing.

8 Claims, 4 Drawing Sheets ity of twisted individual wires connected to at least one end portion of the single-core conductor; a sheathing that envelops the stranded line conductor in a state in which a junction portion of the stranded line conductor that is joined to the single-core conductor is exposed; and a tubular member that envelops, protects and insulates an entirety of the single-core conductor and an entirety of a portion of the stranded line conductor that is exposed from an end portion of the sheathing.

SHIELD CONDUCTIVE PATH

TECHNICAL FIELD

The claimed subject matter relates to a shield conductive path.

BACKGROUND ART

Conventionally, in vehicles such as hybrid vehicles, there are cases where multiple electrical lines are routed under the bottom of the vehicle in order to connect devices installed in the back part of the vehicle, such as high-voltage batteries, to devices installed in the front part of the vehicle, such as inverters and fuse boxes. In this regard, a technique is known in which electrical lines are inserted into a metallic shield pipe to not only electromagnetically shield them, but also protect them from interference by foreign objects (e.g., see JP 2004-171952A). Shield conductive paths that have this sort of configuration undergo bending in accordance with the predetermined routing path after the electrical lines have been inserted into the shield pipe.

JP 2004-171952A is an example of related art.

SUMMARY

However, there are many cases where the electrical lines that have been inserted into the shield pipe are stranded electrical lines, which are stranded line conductors that are made up of multiple individual twisted wires and have been enveloped in a sheathing. Because these stranded electrical lines flex easily, to a certain extent the diameter dimension of the shield pipe needs to be made larger to insert them into the shield pipe. However, considering the minimum ground clearance, it is desirable to reduce the diameter dimension of the shield pipe as much as possible in the case of the shield conductive path routed under the bottom of a vehicle.

In view of this, rather than using the above stranded electrical line, it is conceivable to change the electrical line to a single-core electrical line, which is a single-core conductor that is made up of a single conductor and has been enveloped in a sheathing. In doing so, the diameter dimension of the electrical line itself can be reduced, and since the single-core electrical line does not easily flex, the electric cord can be inserted into a shield pipe with a small diameter dimension, and thus it is thought that the diameter dimension of the shield pipe can be reduced.

However, it is a difficult task to connect a single-core electrical line that does not easily flex to a device because the position of the end portion (the junction portion with the device) cannot be freely bent to match the position of the junction portion awaiting it on the device. For this reason, it is conceivable to connect a stranded electrical line to the end portion of a single-core electrical line, such that the part inserted into the shield pipe is the single-core electrical line that does not easily flex, but has a small diameter, and the part arranged on the outside of the shield pipe is the stranded electrical line that has a large diameter but easily flexes.

However, the number of manufacturing processes increases for the shield conductive path with this configuration when compared to a shield conductive path that only includes a stranded electrical line. Specifically, the number of manufacturing processes increases to include a single-core line manufacturing process in which the single-core electrical line is manufactured by enveloping a single-core conductor with a sheathing, a single-core line sheathing stripping process in which the sheathing in the end portion of the single-core electrical line is stripped to expose the single-core conductor, a conductor connection process in which the single-core conductor and a stranded line conductor are connected, and a conductor protection process in which the exposed portions of both conductors, including the junction portion between the single-core conductor and stranded line conductor, are covered with a protective member. For this reason, there has been desire for an innovation to reduce the number of processes for manufacturing the shield conductive path.

The present claimed subject matter has been achieved in light of the above-described circumstances, and an object thereof is to provide a shield conductive path with which the number of manufacturing processes can be reduced.

A shield conductive path according to the exemplary embodiments include: a single-core conductor made up of a single conductor inserted into a pipe having a shield function; a stranded line conductor made up of a plural According to the exemplary embodiments, the tubular member functions both as the sheathing that envelops the single-core conductor and as the protective member that covers the exposed portions of both conductors, including the junction portion between the single-core conductor and the stranded line conductor, thus eliminating the need for the single-core line manufacturing process in which the single-core electrical line is manufactured by enveloping a single-core conductor with the sheathing, and the single-core line sheathing stripping process in which the sheathing in the end portion of the single-core electrical line is stripped to expose the single-core conductor, and therefore the number of manufacturing processes for the shield conductive path can be reduced.

EXEMPLARY EMBODIMENTS

In the shield conductive path of the exemplary embodiments, the tubular member may be a shrink tube. Also, in the shield conductive path of the exemplary embodiments, an adhesive may be applied between an end portion of the tubular member and the sheathing. According to this configuration, water proofing properties and insulation properties due to the tubular member can be further increased because the end portion of the tubular member and the sheathing are more reliably brought into close contact. Also, in the shield conductive path of the exemplary embodiments, a plurality of the single-core conductor and a plurality of the stranded line conductor may be provided, and the junction portions between the single-core conductors and the stranded line conductors may be arranged so as to connect to each other in the axial direction.

According to this configuration, in addition to the width dimension being reduced by an amount corresponding to the sheathing removed from the single-core conductor at the junction portion, the lateral arrangement of junction portions, which are prone to having a larger width dimension in comparison to other portions, can be prevented, thus making it possible to prevent the sideways expansion of the shield conductive path at the junction portions of the single-core conductor and stranded line conductor.

The following is a detailed description of an exemplary embodiment with reference to FIGS. 1 to 4.

Figure 1:
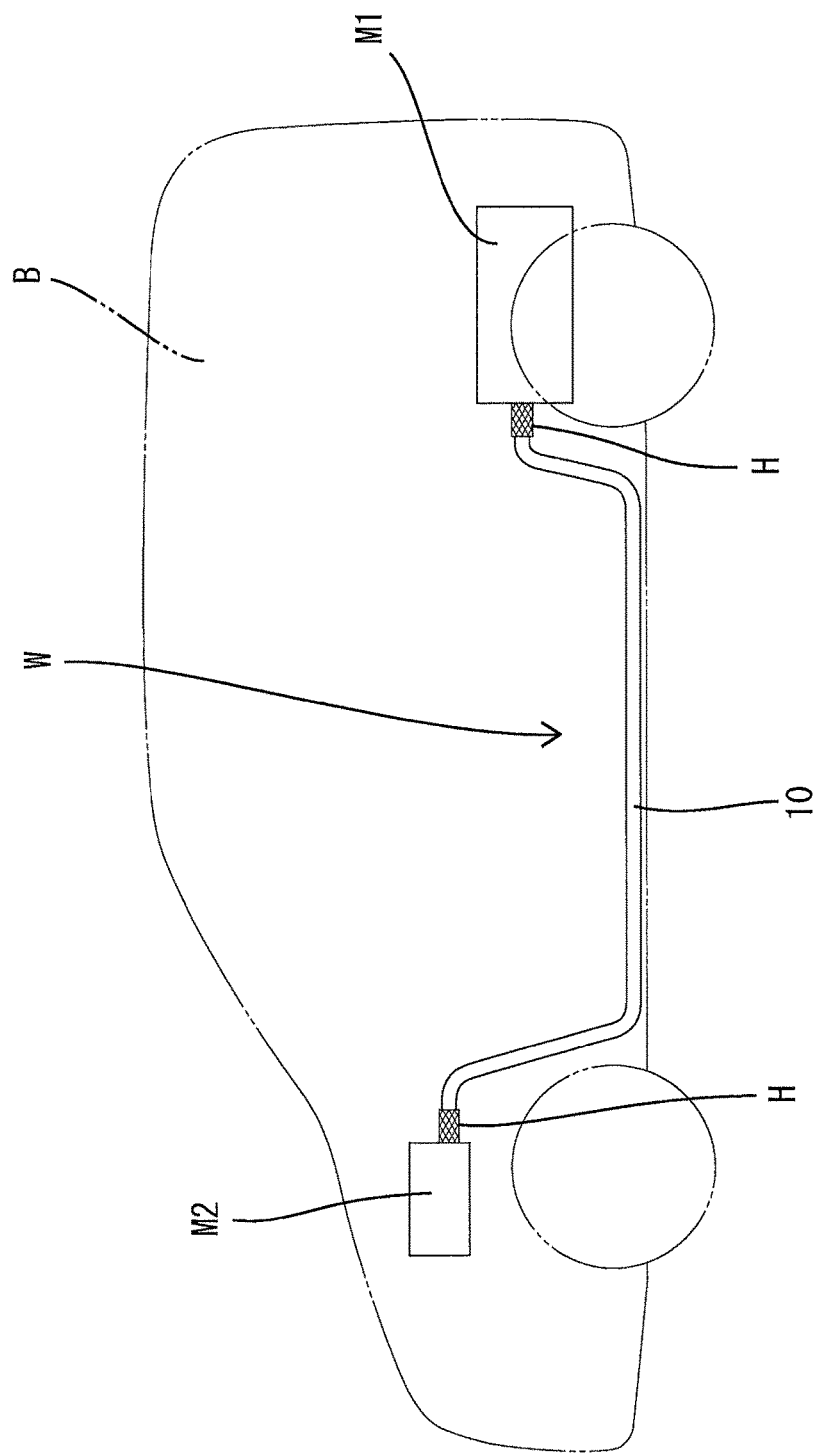
FIG. 1 is a schematic side view showing a routing path of a shield conductive path according to an exemplary embodiment.

As shown in FIG. 1, in a vehicle B such as a hybrid vehicle, a shield conductive path W of the above exemplary embodiment is routed under the bottom of the vehicle B in order to connect a device M1 installed in the back part of the vehicle B, such as a high-voltage battery, to a device M2 installed in the front part of the vehicle B, such as an inverter or a fuse box. Note that each of the devices M1 and M2 are contained within a conductive shield case.

The shield conductive path W includes a pipe with a shield function (hereinafter referred to as "shield pipe 10"), into which multiple bare single-core conductors 11 (two in the present embodiment), each made up of a single conductor, are inserted in order to electromagnetically shield them. The single-core conductor 11 is a single metal rod made of a metal or a metal alloy, such as, for example, copper or a copper alloy, and is formed so as to have a circular cross-section, and has comparatively high robustness and does not easily flex.

Figure 3:
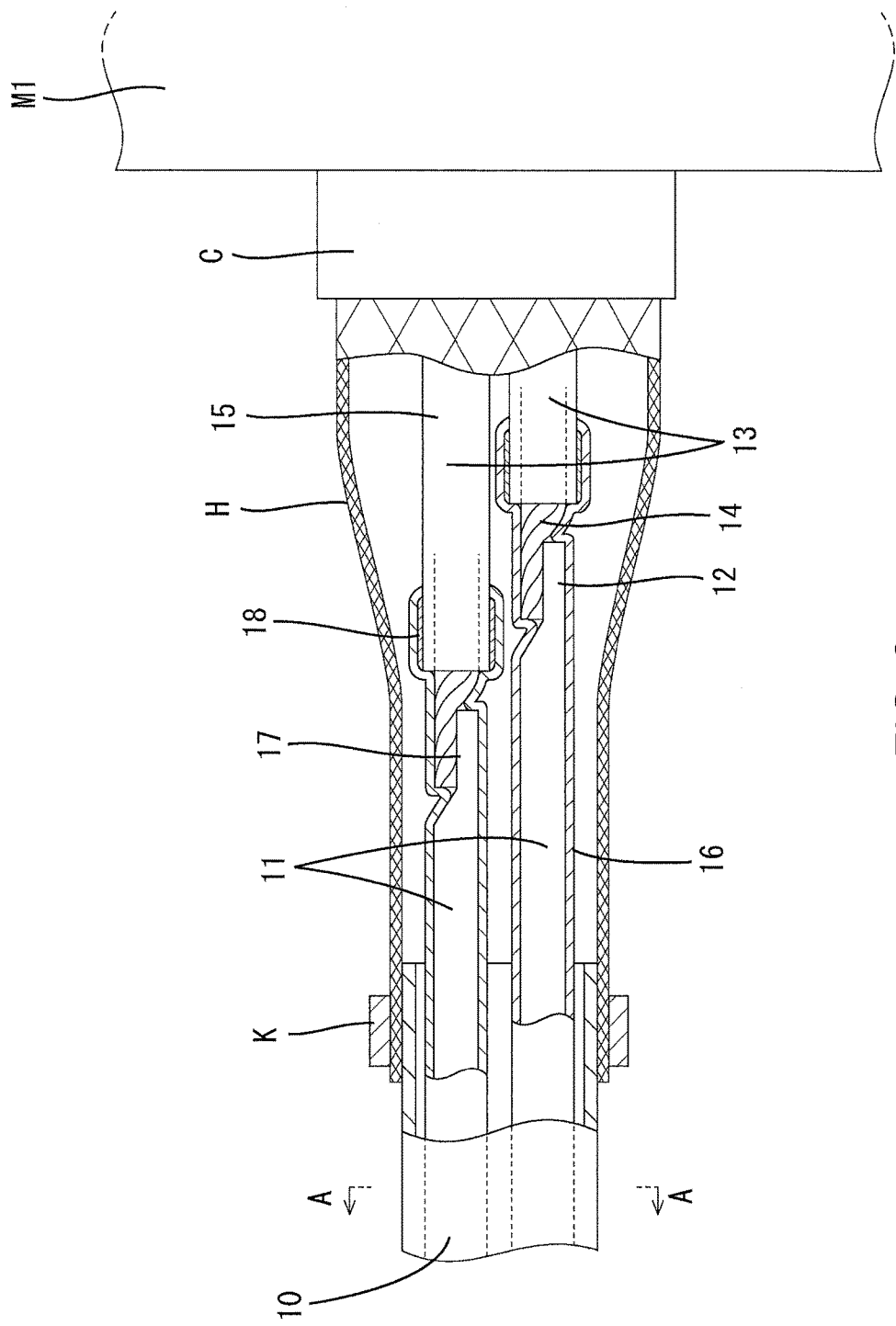
FIG. 3 is a side cross-sectional view showing an enlargement of a junction portion between a single-core line and a stranded line.

As shown in FIG. 3, the single-core conductor 11 is drawn out from the shield pipe 10, and an end portion thereof is collapsed from one side into a flat shape to form a collapsed portion 12. The length dimension of the portion of the single-core conductor 11 that is drawn out from the shield pipe 10 is different between the two single-core conductors 11, and the collapsed portions 12 are arranged to extend in the axial direction. The collapsed portions 12 are connected to terminal portions of the stranded electrical lines 13.

The stranded electrical line 13 is a non-shielded electrical line in which a stranded line conductor 14, made up of multiple individual wires twisted into a helix, and the external circumference of the stranded line conductor 14 is enveloped in a sheathing 15. Each individual wire is formed from a metal or a metal alloy, such as, for example, copper or a copper alloy. The stranded line conductor 14 has low rigidity and easily flexes.

The sheathing 15 is stripped from both end portions of the stranded electrical line 13 over a range having a predetermined length, and the stranded line conductor 14 is exposed (see FIG. 3). The end portion on one end side of the stranded electrical line 13 is joined to the collapsed portion 12 of the single-core line by a method such as soldering or welding, and the end portion on the other side is connected to a terminal metal fitting that is not illustrated. Each of the terminal metal fittings is housed in a connector C, and by mating a connector of either the device M1 or M2 to the connector C, an electrical connection can be made with the device M1 or M2 side.

Figure 2:
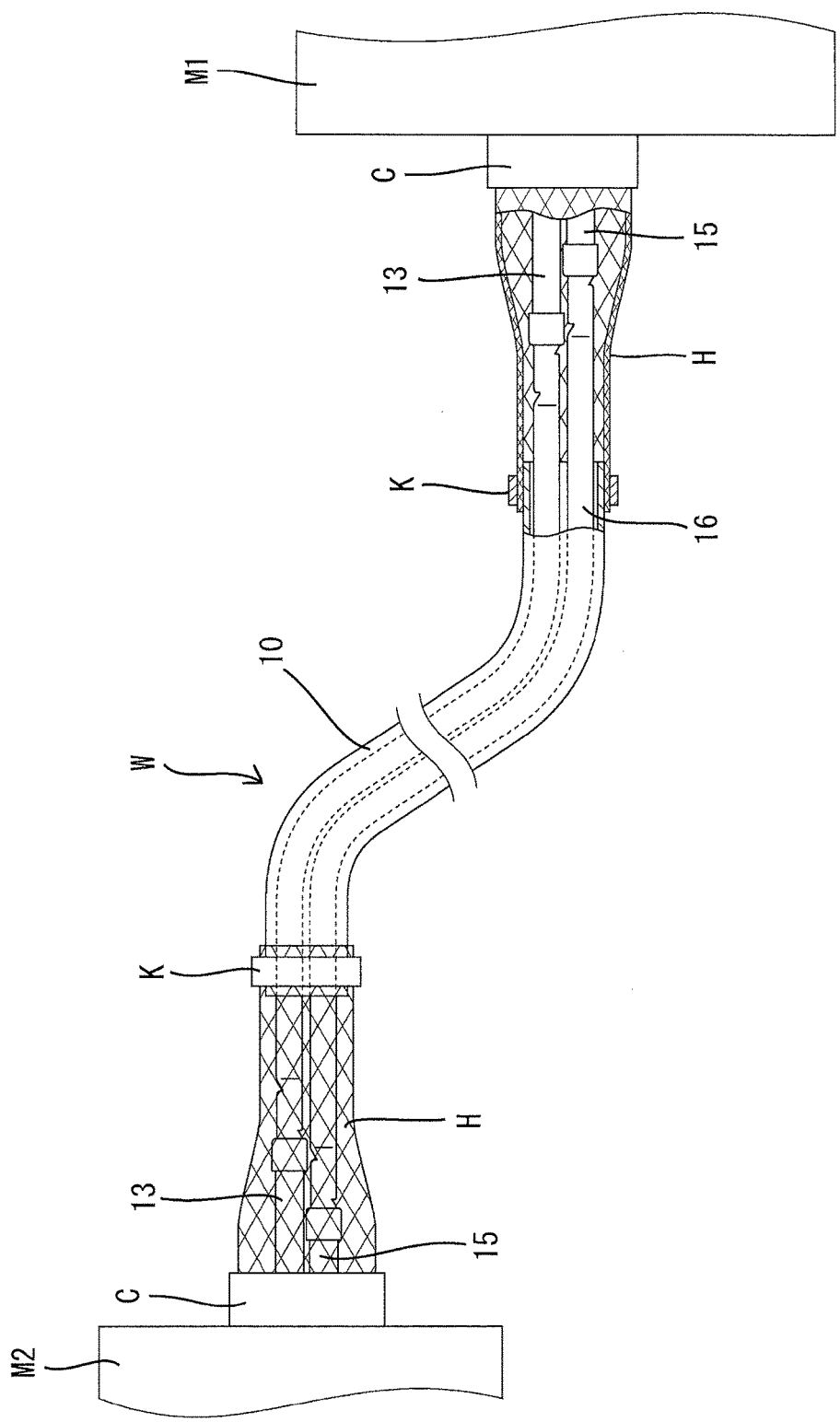
FIG. 2 is a partially enlarged side cross-sectional view showing the configuration of both end portions of the shield conductive path.

As shown in FIG. 2, the portion of the single-core conductor 11 drawn out of the shield pipe 10, and the portion of the stranded electrical line 13 drawn out from the connector C are collectively enveloped with a braided member H. The braided member H is made with a thin metallic wire that has electric conductive properties, such as copper, and is weaved into a mesh, then formed into a tubular shape. Note that enveloping may be done with a metallic foil or metallic foil with a slit instead of the braided member H.

One end side of the braided member H is swaged to the outer circumferential surface of the shield pipe 10 with a metallic band K so as to be fixedly attached and allow conduction, and the other end side is fixedly attached to the connector C so that conduction is possible.

Figure 4:
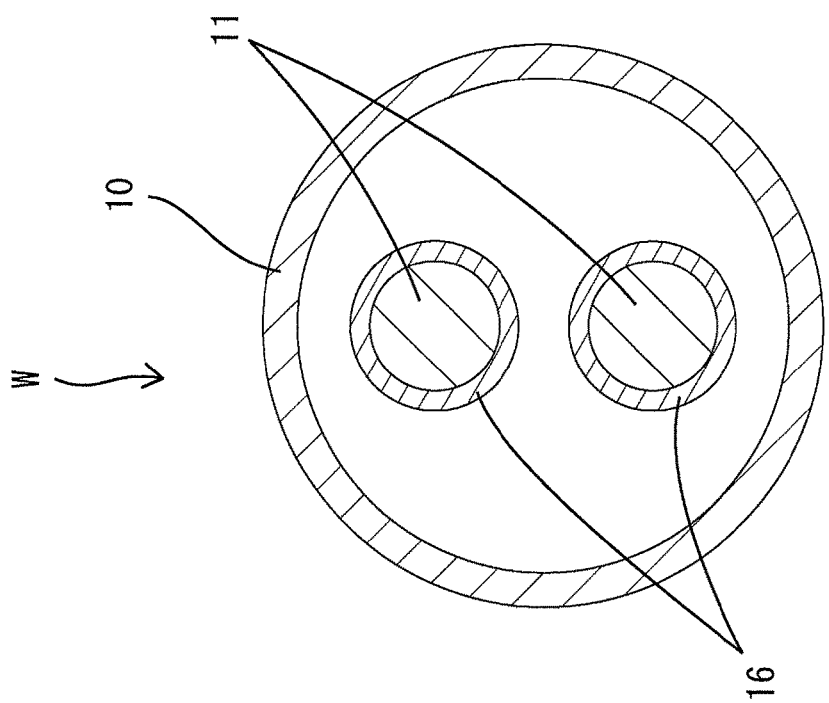
FIG. 4 is a cross-sectional view showing the cross-sectional configuration of the shield conductive path, and is a cross-sectional view that corresponds to the cross-section at position A-A in FIG. 3.

The shield pipe 10 is made of metal, such as iron, aluminum, copper or stainless steel, and the external form is a cylindrical form in a perfect circle (see FIG. 4). As shown in FIG. 1, the shield pipe 10 is bent in a 3D direction into a shape that follows a predetermined routing path. Note that other than a metallic shield pipe, the shield pipe 10 may be an electrically conductive resin pipe.

Next, the entire circumference of the single-core conductor 11 and the portion of the stranded line conductor 14 exposed from the sheathing 15 are enveloped by a shrink tube (tubular member) 16. The shrink tube 16 is a heat shrink tube, where the diameter dimension is shrunk to a small dimension by adding heat, and has enough length to sufficiently cover all of the single-core conductor 11 and all of the exposed portion of the stranded line conductor 14 after being shrunk. Also, the shrink tube 16 has a sufficient thickness dimension to be waterproof and insulate and protect the single-core conductor 11 and the exposed portion of the stranded line conductor 14.

The shrink tube 16 envelops the entirety of the single core conductor 11 from one end to the other end and the entire exposed portion of the stranded line conductor 14, and the end portion is placed over and attached to the end portion of the sheathing 15 of the stranded electrical line 13 (see FIG. 3). An adhesive 18 is applied between the end portion of the shrink tube 16 and the end portion of the sheathing 15 of the stranded electrical line cable 13. Due to the adhesive 18, the end portion of the shrinking tube 16 and the end portion of the sheathing 15 for the stranded electrical line 13 are brought into close contact without gaps over the entire circumference, and the invasion of water from the end portion of the shrink tube 16 can be reliably prevented, and insulation properties can be increased.

The portion of the shrink tube 16 that envelops the single-core conductor 11 envelops the single core conductor 11 and functions as a covering that insulates and protects. Also, the portion of the shrink tube 16 that envelops a junction portion 17 for the single-core conductor 11 and the stranded cord conductor 14 functions as a protective member that protects the junction portion 17 by keeping it sealed and in a state of insulation.

Next is a description of an example of the manufacturing operation for the shield conductive path W of the present embodiment. First, the single-core conductor 11 is inserted into the shield pipe 10. Prior to shrinking, each of the single core conductors 11 is sheathed with the shrink tube 16. Then, the end portions of the single core conductors 11 are drawn out to respective predetermined length dimensions from the shield pipe 10.

Next, the stranded electrical lines 13 are connected to respective end portions of the single-core conductors 11. At this time, the positions of the end portions of the single-core conductors 11 (the collapsed portions 12), i.e. the junction positions with the stranded electrical lines 13, are connected in a stepwise manner in the axial direction, and thus the connection task can be easily carried out. Also, an increase in the width dimension for the shield conductive path W (the shield conductive path W spreads out) in this portion can be prevented because the positions of the junction portions 17 are not arranged side-by-side in the axial direction.

Next, each shrink tube 16 is shrunk. The shrink tube 16 that is pre-sheathed to the single-core conductor 11 is disposed at a position at which the end portion covers the end portion of the sheathing 15 of the stranded electrical line 13. Then, the adhesive 18 is applied between the sheathing 15 of the stranded electrical line 13 and the end portion of the shrink tube 16. After that, at least a portion of the shrink tube 16 from the junction portion 17 between the single-core conductor 11 and the stranded line conductor 14 to the end portion of the sheathing 15 of the stranded line conductor 13 is heated so as to be shrunk and brought into close contact. In doing so, the end portion of the shrink tube 16 and the sheathing 15 of the stranded electrical line 13 are securely adhered without any gaps through using the adhesive 18. By doing so, the single-core conductor 11 and the junction portion 17 are kept in a sealed state and insulated state. Note that the entirety of the shrink tube 16, including the portion arranged inside the shield pipe 10, may be heated to be brought into close contact with the single-core conductor 11 and the stranded core conductor 14.

After that, the shield pipe 10 is then bent into a predetermined shape. This completes the manufacturing operation of the shield conductive path W.

Next is a description of the actions and effects of the present embodiment as configured above.

The shield conductive path W in the present embodiment has a single-core conductor 11 made up of the single conductor that is inserted into the shield pipe 10, and the stranded line conductor 14 made up of multiple twisted individual wires connected to the end portion of the single-core conductor 11. The stranded line conductor 14 is enveloped by the sheathing 15 such that the junction portion 17 with the single-core conductor 11 is in an exposed state, and the entirety of the single-core conductor 11 and the portion of the stranded line conductor 14 exposed from the sheathing 15 are enveloped by the shrink tube 16 and are insulated and protected.

According to this configuration, the tubular member 16 functions both as the sheathing that envelops the single-core conductor 11 and as the protective member that covers the exposed portions of both conductors 11 and 14, including the junction portion 17 between the single-core conductor 11 and the stranded line conductor 14, thus eliminating the need for the single-core line manufacturing process in which the single-core electrical line is manufactured by enveloping a single-core conductor 11 with the sheathing, and the single-core line sheathing stripping process in which the sheathing in the end portion of the single-core electrical line is stripped to expose the single-core conductor 11, and therefore the number of manufacturing processes for the shield conductive path W can be reduced.

Also, the adhesive 18 is applied between the end portion of the shrink tube 16 and the sheathing 15. According to this configuration, insulation and waterproof capabilities provided by the shrink tube 16 can be further increased because the end portion of the shrink tube 16 and the sheathing 15 are more reliably in close contact.

Also, two of both the single core conductor 11 and the stranded line conductor 14 are provided, and the junction portions 17 for the single-core conductor 11 and the stranded line conductor 14 are arranged so as to connect to each other in the axial direction. According to this configuration, in addition to the width dimension being reduced by an amount corresponding to the sheathing removed from the single-core conductor 11 at the junction portion 17, the lateral arrangement of the junction portions 17, which are prone to having a larger width dimension in comparison to other portions, can be prevented, thus making it possible to prevent the sideways expansion of the shield conductive path W at the junction portions 17 of the single-core conductor 11 and stranded line conductor 14.

Other Exemplary Embodiments

The claimed subject matter is not limited to the above exemplary embodiment described using the above description and diagrams, and additional exemplary embodiments such as the following, also fall under the technical scope of the claimed subject matter.

1) The case where two single-core conductors 11 are inserted into the shield pipe 10 was described in the above exemplary embodiment, but three or more of the single-core conductors may be inserted into the shield pipe.

2) In the above exemplary embodiment, the shield conductive path W is connected to the devices M1 and M2 via the stranded electrical lines 13 connected to both ends of the single-core conductor 11, but there is no limitation to this, and for example, in cases where one end side of the shield conductive path is connected to a device with comparatively low vibration, the end portion of the single-core conductor may be directly connected to the device on the side of the device to be connected, without doing so through the stranded electrical line, or the end portion of the tubular member may be brought into close contact with the junction portion on the device side.

3) In the above exemplary embodiment, the external shape of the shield pipe 10 is in the shape of a perfect circle, but there is no limitation to this, and the external shape of the shield pipe may be any shape, including ellipses, ovals and polygons.

4) In the above exemplary embodiment, two junction portions 17 are arranged so as to connect to each other in the axial direction of the shield pipe 10, but there is no limitation to this, and the positions of the junction portions in the axial direction may be in alignment.

5) In the above exemplary embodiment, the case was described in which the tubular member is the shrink tube 16, but there is no limitation to this, and for example, a configuration is possible in which the tubular member is a tubular object that the entire single core conductor and entire portion of the stranded line conductor exposed from the sheathing can be inserted into, and at least the end portion thereof is provided with a narrowing part that can narrow down so as to come into close contact with the end portion of the sheathing of the stranded line conductor.

6) In the above exemplary embodiment, the braided member H is fixedly attached to the outer circumferential surface of the shield pipe 10 by swaging, but there is no limitation to this, and the braided member may be fixedly attached to the inner circumferential surface of the shield pipe.

7) In the above exemplary embodiment, the single-core conductor 11 and the stranded line conductor 14 were made of a metal or a metal alloy, such as, for example, copper or copper alloy, but there is no limitation to this, and the single-core conductor and stranded line conductor may be made of other metals and other alloys such as aluminum and aluminum alloys, etc.

LIST OF REFERENCE NUMERALS

W Shield conductive path
10 Shield pipe (pipe)
11 Single-core conductor
14 Stranded line conductor
15 Sheathing
16 Shrink tube (tubular member)
17 Junction portion
18 Adhesive

What is claimed is:

1. A shield conductive path comprising:
a pipe configured to shield an interior portion within the pipe;
a single-core conductor formed of a single conductor inserted into the interior portion of the pipe;
a stranded line conductor formed of a plurality of twisted individual wires, the stranded line conductor having a junction portion connected to at least one end portion of the single-core conductor;
a sheathing enveloping the stranded line conductor in a state in which the junction portion of the stranded line conductor joined to the single-core conductor is exposed; and
a tubular member enveloping an entirety of the single-core conductor and an entirety of a portion of the stranded line conductor exposed from an end portion of the sheathing, the tubular member having a length that covers all of the single-core conductor in a lengthwise direction.

2. The shield conductive path according to claim 1, wherein the tubular member is a shrink tube.

3. The shield conductive path according to claim 2, wherein an adhesive is applied between an end portion of the tubular member and the sheathing.

4. The shield conductive path according to claim 2, wherein
a plurality of the single-core conductor and a plurality of the stranded line conductor are provided on the shield conductive path, and
the junction portions between the plurality of single-core conductors and the plurality of stranded line conductors are arranged so as to connect to each other in an axial direction of the shield conductive path.

5. The shield conductive path according to claim 1, wherein an adhesive is applied between an end portion of the tubular member and the sheathing.

6. The shield conductive path according to claim 5, wherein
a plurality of the single-core conductor and a plurality of the stranded line conductor are provided on the shield conductive path, and
the junction portions between the plurality of single-core conductors and the plurality of stranded line conductors are arranged so as to connect to each other in an axial direction of the shield conductive path.

7. The shield conductive path according to claim 1, wherein
a plurality of the single-core conductor and a plurality of the stranded line conductor are provided on the shield conductive path, and
the junction portions between the plurality of single-core conductors and the plurality of stranded line conductors are arranged so as to connect to each other in an axial direction of the shield conductive path.

8. The shield conductive path according to claim 1, wherein
the tubular member envelopes an entirety of the single-core conductor and an entirety of only a portion of the stranded line conductor exposed from an end portion of the sheathing.

* * * * *